US007955886B2

(12) United States Patent
Marques

(10) Patent No.: US 7,955,886 B2
(45) Date of Patent: Jun. 7, 2011

(54) APPARATUS AND METHOD FOR REDUCING INTERFERENCE

(75) Inventor: Augusto Manuel Marques, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 1076 days.

(21) Appl. No.: 11/094,833

(22) Filed: Mar. 30, 2005

(65) Prior Publication Data

US 2006/0220778 A1 Oct. 5, 2006

(51) Int. Cl.
*H01L 21/00* (2006.01)
*H01L 29/82* (2006.01)
*H01L 27/08* (2006.01)

(52) U.S. Cl. ................ 438/57; 438/10; 438/14; 438/17; 438/66; 438/73; 257/48; 257/108; 257/421; 257/531; 257/E29.167; 257/E21.022; 257/E21.521

(58) Field of Classification Search .................... 438/10, 438/14, 17, 57, 66, 73, 199; 257/48, 108, 257/421, 531, E29.167, E21.022, E21.521
See application file for complete search history.

(56) References Cited

U.S. PATENT DOCUMENTS

| | | | | |
|---|---|---|---|---|
| 5,405,480 | A * | 4/1995 | Benzing et al. | 156/345.48 |
| 6,194,987 | B1 | 2/2001 | Zhou et al. | |
| 6,320,491 | B1 | 11/2001 | Gevorgian et al. | |
| 6,573,822 | B2 | 6/2003 | Ma et al. | |
| 2002/0097042 | A1 | 7/2002 | Kawate et al. | |
| 2002/0131231 | A1 * | 9/2002 | Anthony | 361/321.2 |
| 2004/0130840 | A1 * | 7/2004 | Anthony | 361/111 |
| 2006/0082366 | A1 * | 4/2006 | Goldfine et al. | 324/240 |
| 2006/0226726 | A1 * | 10/2006 | Shim | 310/166 |
| 2006/0238285 | A1 * | 10/2006 | Dimig et al. | 335/270 |

FOREIGN PATENT DOCUMENTS

| | | |
|---|---|---|
| WO | WO9805048 | 2/1998 |
| WO | WO2004012213 | 2/2004 |

* cited by examiner

*Primary Examiner* — Michelle Estrada

(57) ABSTRACT

A method and apparatus is provided for use in an integrated circuit or printed circuit board for reducing or minimizing interference. An inductance is formed using two or more inductors coupled together and configured such that current flows through the inductors in different directions, thus at least partially canceling magnetic fields. When designing a circuit, the configuration of the inductors, as well as the relative positions of portions of the circuit, can be tweaked to provide optimal interference or noise control.

20 Claims, 12 Drawing Sheets

APPARATUS AND METHOD FOR REDUCING INTERFERENCE

FIELD OF THE INVENTION

This patent document relates generally to techniques for reducing interference in a circuit, and more particularly to techniques using magnetically differential inductors to reduce interference in a circuit.

BACKGROUND OF THE INVENTION

In various types of circuits, interference can cause problems with the operation of circuits. Interference can therefore make the design of a system difficult. For example, in a circuit where inductors are used, the inductors can interfere with other components in the circuit.

In the example of mobile radio and telephony applications, demand for smaller and lower cost devices has driven recent research toward the integration of components into single IC's. For example, efforts have been made to integrate radio-frequency (RF) transceivers within a single IC, using technologies such as complementary metal-oxide semiconductor (CMOS) technologies. This type of integration can be difficult and involves solving several problems. In the example of an RF transceiver, the transceiver's circuitry typically includes sensitive components susceptible to interference with other components. In addition, communication standards relating to the operation of the transceiver set requirements for noise, output power, spectral emission, etc., of the transceiver. In order to meet the requirements of the transceiver, and of the applicable standards, a need exists for techniques for reducing or minimizing the interference between components, such as inductors, in an IC.

SUMMARY OF THE INVENTION

An apparatus of the present invention includes an inductor formed by two or more conductive loops, wherein the conductive loops are configured such that magnetic fields generated are at least partially canceled.

Another embodiment of the invention provides a method of reducing interference in a circuit including forming an inductance using two or more inductors, with the inductors arranged such that current flows through the inductors in different directions to at least partially cancel magnetic fields generated from the inductors.

Another embodiment of the invention provides a method of minimizing interference between circuitry on an integrated circuit, including forming an inductance on the integrated circuit using to or more conductive loops coupled together. In one example, the conductive loops define a first axis extending through the conductive loops and a second axis perpendicular to the first axis. In this example, the method includes configuring the conductive loops such that current flows in opposite directions through some of the loops to at least partially cancel magnetic fields generated from the loops, and such that magnetic cancellation is maximized at locations along the second axis. The relative positions circuitry is configured to achieve a desired amount of magnetic cancellation.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
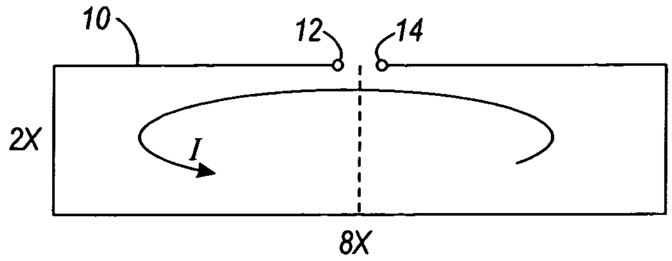
FIG. 1 is a diagram representing an inductor having a single loop.

An IC utilizing techniques of the present invention may be used for any desired application, including wireless transmission systems such as mobile or cellular communication devices or other wireless devices. Note, however, that the present invention may be used in any other application where it is desirable to reduce or minimize interference in a circuit formed on a printed circuit board, an IC, or any other type of package.

In order to provide a context for understanding this description, the following description illustrates one example of a typical application of the present invention. Techniques may be used to help provide a highly integrated, low cost, low form-factor RF apparatus, while also satisfying the requirements of any applicable standards that govern the performance of the RF apparatus. In one example, an RF apparatus takes the form of an RF receiver or transceiver for a high performance communication system. Such an apparatus may include various blocks of circuitry that perform the various functions of the RF apparatus. Examples of circuitry blocks in an RF transceiver may include digital processing circuitry, voltage controlled oscillator (VCO) circuitry, antenna interface circuitry, transmit circuitry, receive circuitry, etc. Some blocks of circuitry may tend to interfere with other blocks of circuitry during the operation of the RF apparatus. For example, the VCO circuitry may include one or more inductors that may interfere with digital circuitry in another circuitry block. Interference can result from both intentional loops (e.g., an inductance included in a design) and parasitic loops (e.g., inductances resulting from the routing of conductors in a circuit). For the RF apparatus to function properly and meet the applicable specifications, the interference and noise needs to be reduced or minimized to a desirable level. The present invention provides techniques for overcoming interference effects.

When forming inductors to be used with the techniques of the present invention, it is helpful to appreciate the various ways that an inductance can be formed. In parts of a circuit where an inductance is desired, the inductance can be provided in numerous ways. In one example, an inductor can be formed by one or more turns of a conductive loops. In the example of an IC, an inductor can be formed on one or more layers of the IC. In other examples, an inductance (whether desired or not) may result from the routing of conductive traces used to connect components together in a device.

Generally, inductors having multiple turns are used to increase the inductance in a given area or to improve the Q (inductor quality factor) of the inductor. One disadvantage of multiple turns is that the added resistance can be significant, reducing the Q of the inductor.

The present invention addresses the problem of interference by designing inductive structures in such a way that magnetic fields generated by the structures is at least partially canceled. One feature of the invention relates to configuring inductive structures such that the inductive structures function as magnetically differential inductors. For example, a magnetically differential inductive structure may take the form of two or more inductors configured so that current flows in opposite directions (e.g., clockwise in one inductor and counterclockwise in the other inductor). With current flowing in opposite directions in two similar inductors, the magnetic fields created by the current flowing through the inductors will at least partially cancel each other out. As detailed below, there are many ways of configuring a magnetically differential inductive structure.

In some conventional applications, without taking interference into account, inductor designs use inductors with one loop where a single loop provides the most desired properties. The present invention utilizes structures with two differential loops, in order to reduce or minimize noise and interference with other components in a device. In other examples, structures can be used with more than two loops, where the combination of loops are configured to at least partially cancel the magnetic fields generated by all of the loops.

Discussed below are examples of two types of differential inductive structures. A first example of a differential inductive structure uses two series coupled inductors configured such that current flows in the opposite direction in each of the inductors. A second example of a differential inductive structure uses two parallel coupled inductors configured such that current flows in the opposite direction in each of the inductors. As described below, each type of structure has advantages over the other type, depending on the specific application.

Figure 2:
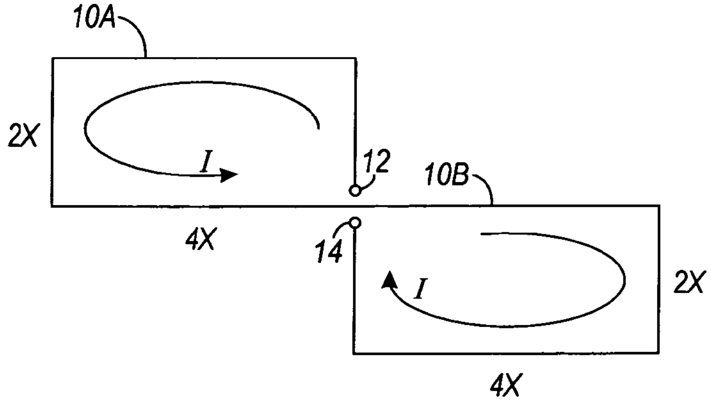
FIG. 2 shows two magnetically differential inductors coupled in series.
Figure 3:
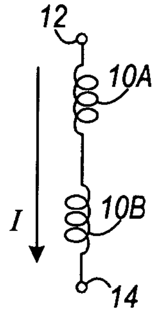
FIG. 3 is an equivalent circuit diagram of the inductors shown in FIG. 2.

When looking two inductors coupled in series, first consider a single loop that has a given inductance L and area A. FIG. 1 is a diagram representing an inductor 10 having a single loop with terminals 12 and 14. FIG. 1 also shows the relative dimensions of the inductor 10, which define the area A of the inductor 10. The direction of current I that flows through the inductor 10 is also shown in FIG. 1. FIG. 2 shows first and second inductors 10A and 10B coupled in series between terminals 12 and 14. The inductors 10A and 10B are each half the size of the inductor 10. The inductors 10A and 10B can be thought of as inductor 10 broken at the dashed line, flipped vertically, with their ends joined. As discussed again below, other types of series coupled loops are also possible. FIG. 3 is an equivalent circuit diagram of the inductors 10A and 10B, showing the series connection, and the direction of the current through the inductors 10A and 10B. In the configuration shown in FIG. 2, the inductors 10A and 10B are arranged in an approximate figure-eight pattern (as are the series coupled examples described below).

Since the sum of the areas of inductors 10A and 10B are equal to the area of the inductor 10 shown in FIG. 1, the inductance between terminals 12 and 14 will be the same as the inductance of inductor 10. The total resistance of inductors 10A and 10B may be slightly greater than the resistance of inductor 10, due to the increased length of the conductors (by approximately 4×, where X represents a length, and 4× represents four times the length X).

Therefore, a comparison of the single loop inductor 10 shown in FIG. 1 with the series coupled loops 10A and 10B follows. First, the inductance (first order) will be the same. Second, the Q should be a little worse in the series coupled inductors. Finally, the feature in which the present invention take advantage is the magnetic cancellation that takes place in the inductors 10A and 10B. Since the magnetic field induced by the current I flowing through inductor 10A will be opposite of the magnetic field induced by the current I flowing through inductor 10B, the total magnetic field from the inductors 10A and 10B will at least partially cancel out at distances relatively far away from the inductor. The amount of magnetic field cancellation depends on factors such as the distance from the magnetically differential inductors, as well as the direction from the magnetically differential inductors. These two factors are discussed in detail below.

Figure 4A:
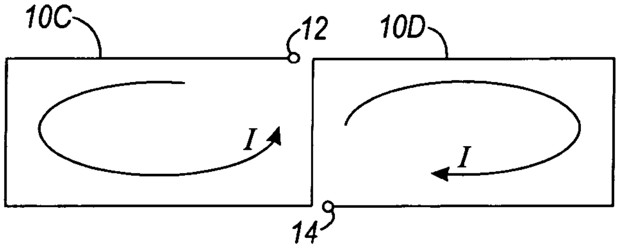
FIG. 4A shows another example two magnetically differential inductors coupled in series.

As mentioned above, other configurations of series coupled loops are possible. FIG. 4A shows another example of series coupled magnetically differential inductors. FIG. 4A shows first and second inductors 10C and 10D coupled in series between terminals 12 and 14. Like the example shown in FIG. 2, the inductors 10C and 10D are each half the size of the inductor 10 shown in FIG. 1. An equivalent circuit diagram of the example shown in FIG. 4 would be similar to the diagram shown in FIG. 3.

Like the inductive structure shown in FIG. 2, the sum of the areas of inductors 10C and 10D are equal to the area of the inductor 10 shown in FIG. 1. Therefore, the inductance between terminals 12 and 14 will be the same as the inductance of inductor 10. The total resistance of inductors 10C and 10D may be slightly greater than the resistance of inductor 10, due to the increased length of the conductors (by approximately 2×). A comparison of the single loop inductor 10 shown in FIG. 1 with the series coupled loops 10C and 10D will be similar to the comparison discussed above. First, the inductance (first order) will be the same. Second, the Q should be a little worse in the series coupled inductors, but perhaps better than the example shown in FIG. 2. Also like the example shown in FIG. 2, the magnetic fields generated by inductors 10C and 10D are at least partially cancelled.

Figure 4B:
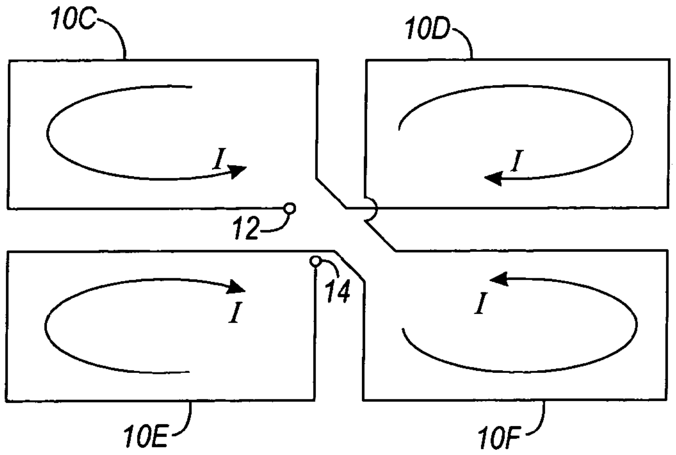
FIG. 4B shows an example four magnetically differential inductors coupled in series.

As mentioned above, any desired number of loops can be used, where the combination of loops are configured to at least partially cancel the magnetic fields generated by the loops. In the examples illustrated in FIG. 2 and FIG. 4A, two loops are shown. FIG. 4B shows another example of series coupled magnetically differential inductors. Instead of two series loops, the examples shown in FIG. 4B includes four series loops. FIG. 4B shows four inductors 10C, 10D, 10E, and 10F coupled in series between terminals 12 and 14. An equivalent circuit diagram of the example shown in FIG. 4B would be similar to the diagram shown in FIG. 3, with the addition of series connected inductors 10E and 10F.

If we assume that sum of the areas of inductors 10C, 10D, 10E, and 10F are twice the area of the inductor 10 shown in FIG. 1, then, the inductance between terminals 12 and 14 will be the twice the inductance of inductor 10. As indicated by the arrows, current through inductors 10C and 10F will flow in the same direction, with current through inductors 10D and 10E flowing in the opposite direction. Therefore, like the examples described above, the magnetic fields generated by inductors 10C, 10D, 10E, and 10F are at least partially cancelled. As mentioned, as many loops as desired can be coupled together (via series and/or parallel combinations) to achieve the result desired.

Figure 5:
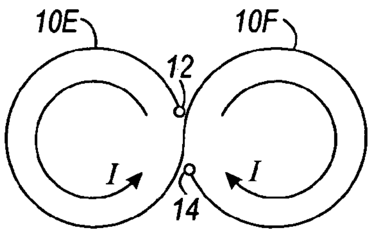
FIG. 5 shows another example of series coupled magnetically differential inductors.

FIG. 5 shows another example of series coupled magnetically differential inductors. FIG. 5 shows first and second inductors 10G and 10H coupled in series between terminals 12 and 14. In this example, the inductors 10G and 10H are round, rather than rectangular. An equivalent circuit diagram of the example shown in FIG. 5 would be similar to the diagram shown in FIG. 3. If the sum of the areas of inductors 10G and 10H shown in FIG. 5 are equal to the area of the inductor 10 shown in FIG. 1, then the inductance between terminals 12 and 14 will be the same as the inductance of inductor 10. Like the examples described above, the magnetic fields generated by inductors 10G and 10H will at least partially cancel since the inductors are configured such that current I flows in opposite directions through the inductors 10G and 10H.

Figure 6:
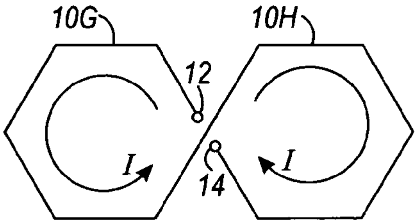
FIG. 6 shows another example of series coupled magnetically differential inductors.

FIG. 6 shows another example of series coupled magnetically differential inductors. FIG. 6 shows first and second inductors 10I and 10J coupled in series between terminals 12 and 14. In this example, the inductors 10I and 10J each have a hexagonal, rather than a rectangular shape. An equivalent circuit diagram of the example shown in FIG. 6 would be similar to the diagram shown in FIG. 3. If the sum of the areas of inductors 10I and 10J shown in FIG. 6 are equal to the area of the inductor 10 shown in FIG. 1, then the inductance between terminals 12 and 14 will be the same as the inductance of inductor 10. Like the examples described above, the magnetic fields generated by inductors 10I and 10J will at least partially cancel since the inductors are configured such that current I flows in opposite directions through the inductors 10I and 10J.

Figure 7:
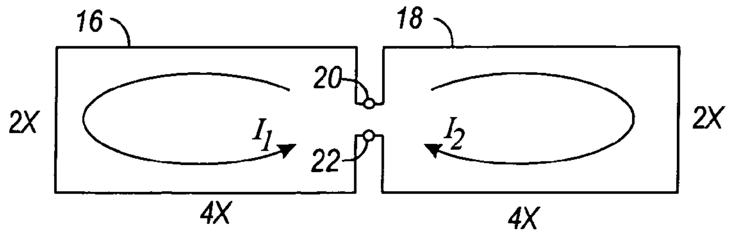
FIG. 7 shows two magnetically differential inductors coupled in parallel.
Figure 8:
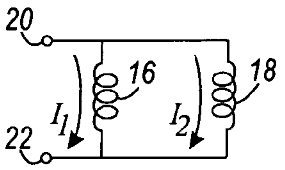
FIG. 8 is an equivalent circuit diagram of the inductors shown in FIG. 7.

A second example of a differential inductive structure uses two parallel coupled inductors configured such that current flows in the opposite direction in each of the inductors. When looking two inductors coupled in parallel, first consider again a single loop that has a given inductance L and area A (e.g., FIG. 1). FIG. 7 shows first and second inductors 16 and 18 coupled in parallel between terminals 20 and 22. In this example, the inductors 16 and 18 are each half the size of the inductor 10 shown in FIG. 1. The inductors 16 and 18 can be thought of as the inductor 10 of FIG. 1 broken at the dashed line, with the current direction changed in one of the halves. Note that other configurations of parallel coupled loops are also possible. FIG. 8 is an equivalent circuit diagram of the inductors 16 and 18, showing the parallel connection, and the direction of the currents $I_1$ and $I_2$ through the inductors 16 and 18, respectively.

Since the sum of the loop areas of inductors 16 and 18 are equal to the area of the inductor 10 shown in FIG. 1, and since the inductors 16 and 18 are coupled in parallel, then the inductance between terminals 20 and 22 will be approximately one fourth the inductance of inductor 10. The total resistance of inductors 16 and 18 may be slightly greater than the resistance of inductor 10, due to the increased length of the conductors.

Therefore, a comparison of the single loop inductor 10 shown in FIG. 1 with the parallel coupled loops 16 and 18 follows. First, the inductance will be one fourth the inductance of the inductor 10. Second, the Q should be a little worse in the parallel coupled inductors, compared to the Q of the inductor 10. Finally, the advantage in which the present invention take advantage is the magnetic cancellation that takes place in the inductors 16 and 18. Since the magnetic field induced by the current $I_1$ flowing through inductor 16 is in a direction opposite of the magnetic field induced by the current $I_2$ flowing through inductor 18, the total magnetic field from the inductors 16 and 18 will at least partially cancel out. The amount of magnetic field cancellation depends on factors such as the distance from the magnetically differential inductors 16 and 18, as well as the direction from the magnetically differential inductors. These two factors are discussed in detail below.

To achieve the same inductance value as a series combination, a parallel combination would require a larger loop area, which may reduce the effects of the magnetic field cancellation. It can therefore be seen that for any given application, either type of inductive structure may be preferable over the other. For example, in applications where a low inductance is desired, parallel coupled magnetically differential inductors may be satisfactory. In applications where a larger inductance is desired, series coupled magnetically differential inductors may be advantageous. As mentioned above, note that other configurations of parallel coupled loops are possible. Also, any desired combination of series coupled to and/or parallel coupled inductors may be used in any given application of the invention.

As mentioned above, the amount of magnetic field cancellation resulting from magnetically differential inductors depends on factors such as the distance from the inductors, as well as the relative direction from the inductors. The effect of the relative direction from the inductors results from the fact that magnetic cancellation will be more effective when the two inductors are the same distance away. To help understand how to optimally place components on an IC or printed circuit board, it is helpful to understand the effect of the direction from the inductors. Following is a discussion of this occurrence.

Figure 9:
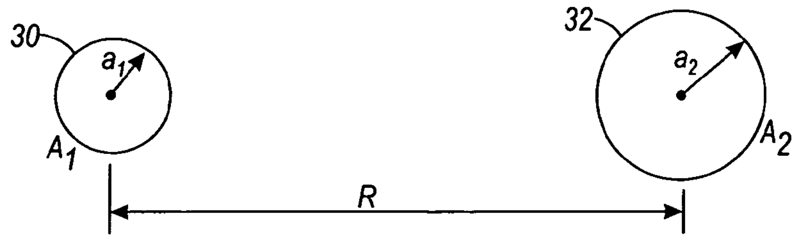
FIG. 9 is a diagram illustrating a first and second current loop.

First, consider how two current loops effect each other. FIG. 9 is a diagram illustrating a first current loop 30 and a second current loop 32. The current loop 30 has a radius $a_1$ and an area $A_1$. The current loop 32 has a radius $a_2$ and an area $A_2$. The loops 30 and 32 are separated by a distance R. The magnetic field resulting from current flowing through loop 30 is illustrated by the following equation:

$$B_1(R) = \frac{\mu_0 I}{4\pi R^3} \cdot \pi a_1^2 = \frac{\mu_0 I}{4\pi R^3} \cdot A_1 \tag{1}$$

The mutual inductance $M_{12}$ is then illustrated by:

$$M_{12}(R) = \frac{B_1 A_2}{I} = \frac{\mu_0}{4\pi} \cdot \frac{A_1 A_2}{R^3} \tag{2}$$

So, the mutual inductance can be approximated by the following equation:

$$M = \frac{\mu_0}{4\pi} \cdot \frac{A_1 A_2}{R^3}. \tag{3}$$

Figure 10:
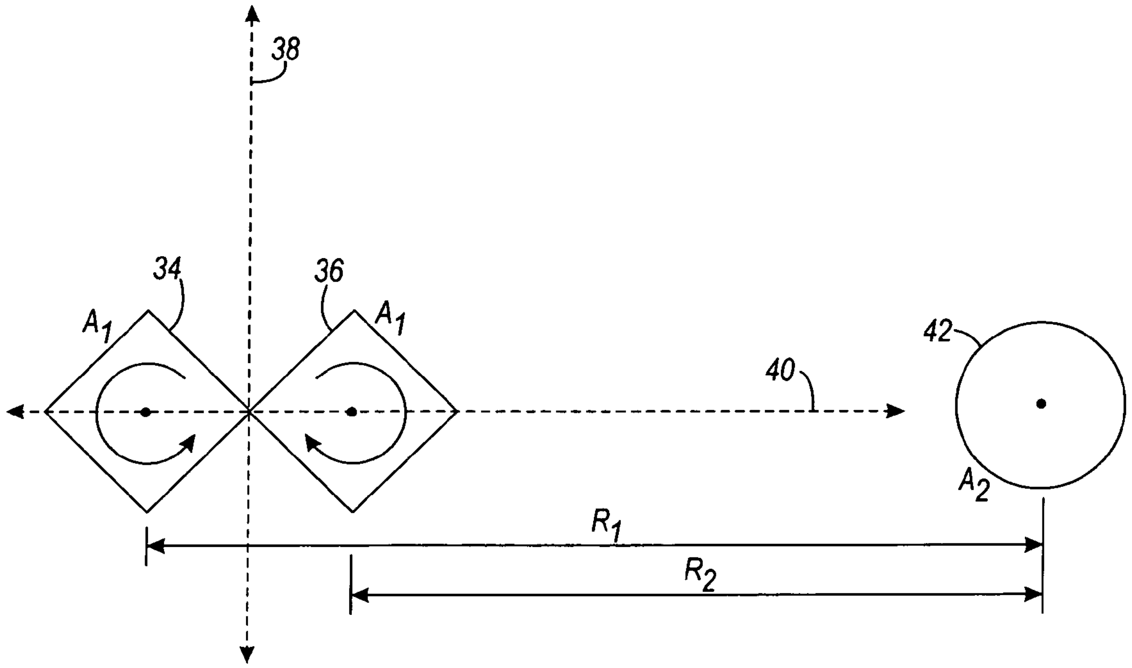
FIG. 10 is a diagram showing magnetically differential inductors and a current loop.

FIG. 10 is a diagram showing series coupled inductors 34 and 36, like the series coupled inductors described above. Note that for clarity, FIG. 10 (and some of the following examples) does not show terminals, but terminals similar to those shown in FIG. 2 will be used in an actual device. The inductors 34 and 36 each have an area $A_1$, and are configured such that current flows through the inductors 34 and 36 in opposite directions, as shown by the arrows. Since magnetic cancellation is optimal where the distance to each of the inductors 34 and 36 is equal (i.e., where the two opposite magnetic fields will be equal), an axis 38 is defined where magnetic cancellation is optimal. At all points along axis 38, the distance to each of the inductors 34 and 36 is equal. A second axis 40 is perpendicular to the axis 38 and extends through the centers of both inductors 34 and 36. With respect to magnetic cancellation, the least amount of magnetic cancellation will be found along axis 40, since one inductor or the other is closer, and therefore will not be completely canceled by the other. The knowledge of where the optimal and worse case directions for magnetic cancellation occur is useful when designing a circuit layout (discussed below). Note that examples where an inductive structure has a large number of loops, there may be multiple directions with good magnetic cancellation.

FIG. 10 also shows a loop 42, which may be a part of a component located elsewhere on an IC or circuit board. As shown, the loop 42 is located along the axis 40, putting the loop 42 at the worst possible angle for magnetic cancellation of inductors 34 and 36. Knowing that loop 42 is at the worst possible angle will enable the calculation of the effectiveness of the worst case magnetic cancellation at various distances.

In FIG. 10, the loop 42 is at a distance $R_1$ from inductor 34, and at a distance $R_2$ from inductor 36. Using equation (3) above, the difference in mutual inductance ($M_{DIFF}$) between loop 42 and each inductor 34 and 36 is shown by the following equation:

$$M_{DIFF} = \frac{\mu_0}{4\pi} \cdot \frac{A_1 A_2}{R^3} \cdot \left[ \frac{R^3}{\left(R - \frac{\Delta R}{2}\right)^3} - \frac{R^3}{\left(R + \frac{\Delta R}{2}\right)^3} \right], \tag{4}$$

where $$R = \frac{R_1 + R_2}{2}$$

(i.e., the average distance between the inductors 34 and 36 and the loop 42), and $\Delta R = R_2 - R_1$ (i.e., the distance between the centers of inductors 34 and 36).

The difference in mutual induction can be expressed as:

$$M_{DIFF} = M \cdot \left[ \frac{R^3}{\left(R - \frac{\Delta R}{2}\right)^3} - \frac{R^3}{\left(R + \frac{\Delta R}{2}\right)^3} \right]. \tag{5}$$

For $$\frac{\Delta R}{2R} \ll 1,$$

equation (5) can be expressed as:

$$M_{DIFF} \cong M \cdot \frac{3\Delta R}{R}. \tag{6}$$

Figure 11:
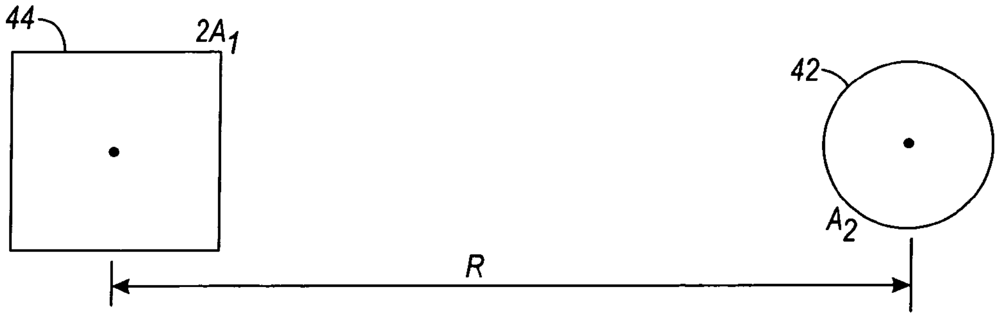
FIG. 11 is a diagram illustrating a single inductor with similar properties to the inductors shown in FIG. 10.

Now, considering a single loop having the same area as the sum of inductors 34 and 36 and separated from loop 42 by distance R. FIG. 11 is a diagram illustrating a single loop 44 having the same area as the sum of inductors 34 and 36. Referring back to equation (3), the mutual inductance ($M_{ONELOOP}$) between inductor 44 and the loop 42 can be shows as:

$$M_{ONELOOP} = \frac{\mu_0}{4\pi} \cdot \frac{2A_1 A_2}{R^3} = 2M \tag{7}$$

Therefore, the relative reduction can be represented as:

$$\frac{M_{DIFF}}{M_{ONELOOP}} = \frac{\frac{3\Delta R}{R}}{2} \tag{8}$$

Now, using equation (8) and entering various values for R and ΔR, the effectiveness of the magnetic cancellation in the worse case scenario (i.e., along axis 40 as shown in FIG. 10) can be determined. Table I is a table illustrating the values of $$\frac{M_{DIFF}}{M_{ONELOOP}}$$

for several distances R. In Table I, ΔR is assumed to be 300 μm, which is a reasonable ΔR in an application using CMOS technologies.

| R | 450 μm | 600 μm | 1000 μm | 1500 μm | 2000 μm |
|---|---|---|---|---|---|
| $\frac{M_{DIFF}}{M_{ONELOOP}}$ | 1.00 | 0.75 | 0.45 | 0.30 | 0.225 |

Note that the calculations in Table I are zero order calculations. Also note that Table I represents the worst case cancellation, and that other directions will be better. Although the improvements shown in the table may appear to be small, the improvements can be significant. Note that, in the example illustrated in Table I, a relatively large structure (300 um) is assumed. For smaller structures, the improvements will be more profound. Also note that several interference effects depend on the second or third power of the mutual inductance In the example of a ΔR of 300 um, a ratio of 0.225 implies an improvement of 13-20 dB, which is very good considering that it is such a large structure. From the data in Table I, it can be concluded that the effectiveness of magnetic cancellation along axis 40 in FIG. 10 improves at greater distances.

One aspect of the present invention relates to the efficient and effective layout of a device, for example, an RF apparatus using CMOS technologies. Where interference is a concern, the present invention enables inductors to be used that reduce or minimize the magnetic fields generated by the inductors. In addition, by knowing where the magnetic cancellation has the greatest effect in a device, components of the device can be designed accordingly to place interfering components in optimal locations relative to the inductors. Further, by changing the geometries of the magnetically differential inductors, the axis of maximum cancellation (e.g., axis 38 in FIG. 10) can be moved and pointed toward a desired direction (described below).

Figure 12:
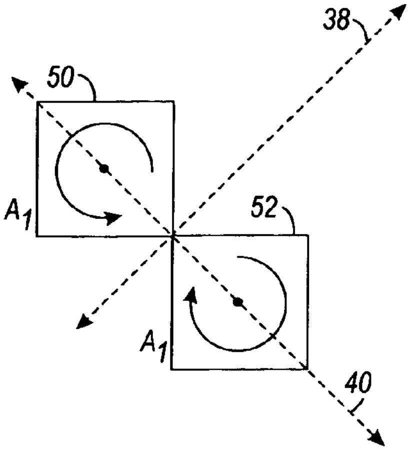
FIG. 12 is a series coupled magnetically differential inductor.

FIG. 12 shows series coupled inductors 50 and 52, which are similar to the inductors 34 and 36 shown in FIG. 10. The inductors 50 and 52 each have an area $A_1$, and are configured such that current flows through the inductors 50 and 52 in opposite directions, as shown by the arrows. Since magnetic field cancellation is optimal where the distance to each of the inductors 34 and 36 is equal, the axis 38 is defined where magnetic cancellation is optimal. The second axis 40 is perpendicular to the axis 38 and extends roughly through the centers of both inductors 50 and 52.

Figure 13:
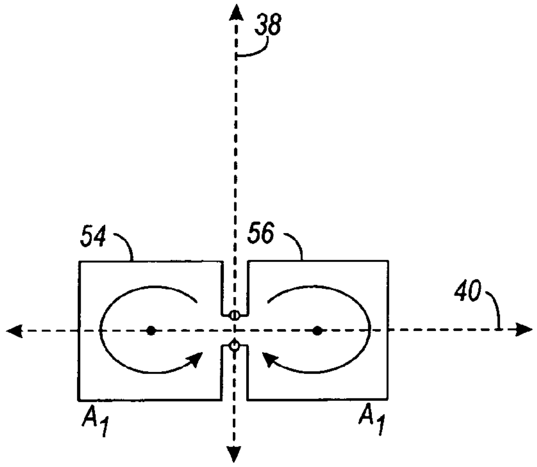
FIG. 13 is a parallel coupled magnetically differential inductor.

FIG. 13 shows parallel coupled inductors 54 and 56, which are similar to the inductors 16 and 18 shown in FIG. 7. The inductors 54 and 56 also each have an area $A_1$, and are configured such that current flows through the inductors 54 and 56 in opposite directions, as shown by the arrows. Like before, the axis 38 is defined where magnetic cancellation is optimal. The second axis 40 is perpendicular to the axis 38 and extends roughly through the centers of both inductors 54 and 56. FIG. 13 illustrates that some of the concepts discussed below apply to both series and parallel coupled magnetically differential inductors, although most of the following examples show series coupled inductors.

As mentioned above, by changing the geometries of the magnetically differential inductors, the axis of maximum cancellation (axis 38) can be moved and pointed toward a desired direction.

Figure 14:
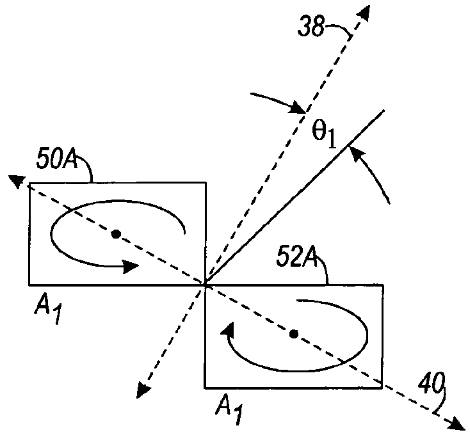
FIGS. 14-15 show other examples of series coupled magnetically differential inductors.

FIG. 14 shows series coupled inductors 50A and 52A, which are similar to inductors 50 and 52 in FIG. 12, but with a different configuration. The inductors 50A and 52A each have the same area $A_1$ as inductors 50 and 52, but have different dimensions. In this example, the inductors 50A and 52A are elongated in the horizontal direction (relative to the view shown in FIG. 14). Since the areas $A_1$ of inductors 50 and 52 are the same as the areas $A_1$ of inductors 50A and 52A, the inductances are the same. However, despite having the same inductance as inductors 50 and 52, the axis 38 in FIG. 14 is offset relative to the axis 38 shown in FIG. 12. Like the examples above, the distance from any point along axis 38 to the inductors 50A and 52A are equal (e.g., from a point on the axis 38 to the center point of each inductor). As shown, the axis 38 in FIG. 14 is $-\theta_1$ degrees relative to the angle of the axis 38 shown in FIG. 12.

Figure 15:
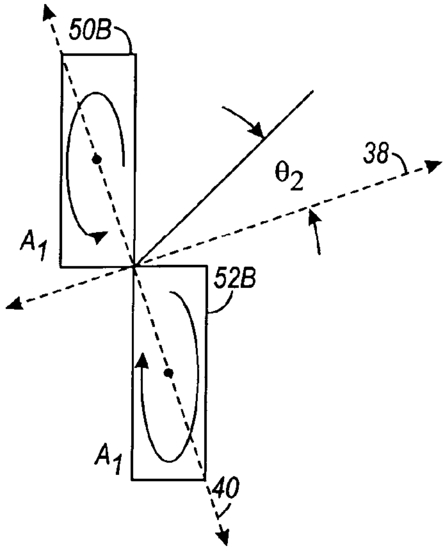

FIG. 15 illustrates another example of magnetically differential inductors. FIG. 15 shows series coupled inductors 50B and 52B, which are similar to the inductors shown in FIGS. 12 and 14, but with yet another configuration. The inductors 50B and 52B each have the same area $A_1$ as inductors 50 and 52, but have different dimensions. In this example, the inductors 50B and 52B are elongated in the vertical direction (relative to the view shown in FIG. 15). Since the areas $A_1$ of inductors 50 and 52 are the same as the areas $A_1$ of inductors 50B and 52B, the inductances are the same. However, despite having the same inductance as inductors 50 and 52, the axis 38 in FIG. 15 is offset relative to the axis 38 shown in FIG. 12. Like the examples above, the distance from any point along axis 38 to the inductors 50B and 52B are equal (e.g., from a point on the axis 38 to the center point of each inductor). As shown, the axis 38 in FIG. 15 is $+\theta_2$ degrees relative to the angle of the axis 38 shown in FIG. 12. FIGS. 14 and 15 illustrate examples of how magnetically differential inductors can be configured to point the axis 38 an any desired direction. Note that, in all of the examples shows, inductors can be configured as mirror images, pointing the axis 38 in different quadrants.

Figure 16:
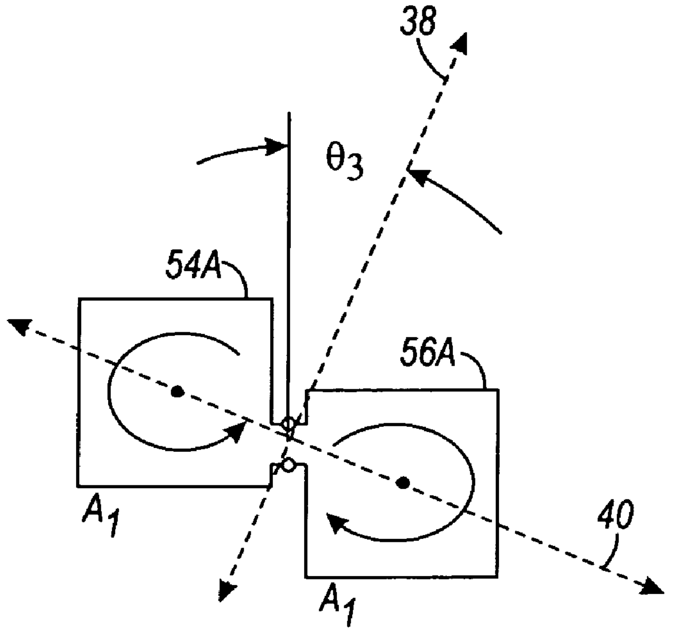
FIGS. 16-17 show other examples of parallel coupled magnetically differential inductors.

FIG. 16 shows parallel coupled inductors 54A and 56A, which are similar to inductors 54 and 56 in FIG. 13, but with a different configuration. The inductors 54A and 56A each have the same dimensions and area $A_1$ as inductors 54 and 56, but are offset. Since the areas $A_1$ of inductors 54 and 56 are the same as the areas $A_1$ of inductors 54A and 56A, the inductances are the same. However, despite having the same inductance as inductors 54 and 56, the axis 38 in FIG. 16 is offset relative to the axis 38 shown in FIG. 13. Like the examples above, the distance from any point along axis 38 to the inductors 54A and 56A are equal (e.g., from a point on the axis 38 to the center point of each inductor). As shown, the axis 38 in FIG. 16 is $+\theta_3$ degrees relative to the angle of the axis 38 shown in FIG. 13.

Figure 17:
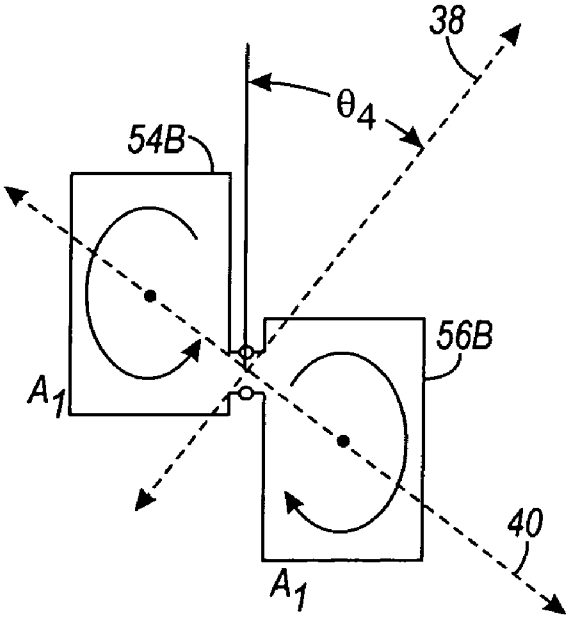

FIG. 17 shows parallel coupled inductors 54B and 56B, which are similar to inductors 54 and 56 in FIG. 13, but with yet another configuration. The inductors 54B and 56B each have the same area $A_1$ as inductors 54 and 56, but are offset. Since the areas $A_1$ of inductors 54 and 56 are the same as the areas $A_1$ of inductors 54B and 56B, the inductances are the same. In the example of FIG. 17, the inductors 54B and 56B are offset as before, but also different dimensions. In this example, the inductors 54B and 56B are elongated in the vertical direction (relative to the view shown in FIG. 17). As shown, the axis 38 in FIG. 17 is offset relative to the axis 38 shown in FIG. 13. Like the examples above, the distance from any point along axis 38 to the inductors 54B and 56B are equal (e.g., from a point on the axis 38 to the center point of each inductor). As shown, the axis 38 in FIG. 17 is $+\theta_4$ degrees relative to the angle of the axis 38 shown in FIG. 13.

The preceding examples of configurations of magnetically differential inductors are merely exemplary configurations. Many other configurations can also be used. For example, non-symmetrical, or non-equivalent inductor pairs can be used. One inductor could be shaped differently than the other inductor, or have different areas, to effect the resulting magnetic fields, as desired. In other examples, multiple sets of magnetically differential inductors can be used to achieve a desired inductance or inductances, while also achieving a desired amount of magnetic cancellation. Also, the teachings illustrated in the examples of FIGS. 12-17 also apply to other shapes and configurations of inductors, as one skilled in the art would understand.

Knowing the magnetic field properties of various possible configurations of magnetically differential inductors can be helpful in designing a layout for a device formed on an IC or printed circuit board. For example, in an RF apparatus integrated on an IC, interference between the various components of the apparatus can make integration difficult. Using the techniques of the present invention, interference problems can be reduced or minimized. Following are some examples illustrating how the techniques discussed above can be used to address interference problems. Note that the techniques discussed apply to any desired application, but the example discussed below is discussed in the context of an RF apparatus formed on an integrated circuit.

An RF apparatus, such as an RF transceiver, may include various blocks of analog and digital circuitry. Depending on the application, frequencies, power levels, circuit loop areas, etc., various interference problems can arise. For example, one or more inductors used on a voltage controlled oscillator (VCO) circuitry may cause interference with digital circuitry located elsewhere on the IC. In some cases, using magnetically differential inductors (such as those discussed above) may solve the interference problem. In other cases the inductors and overall layout may need to be adjusted to bring interference down to a suitable level. Following are examples of such adjustments.

Figure 18:
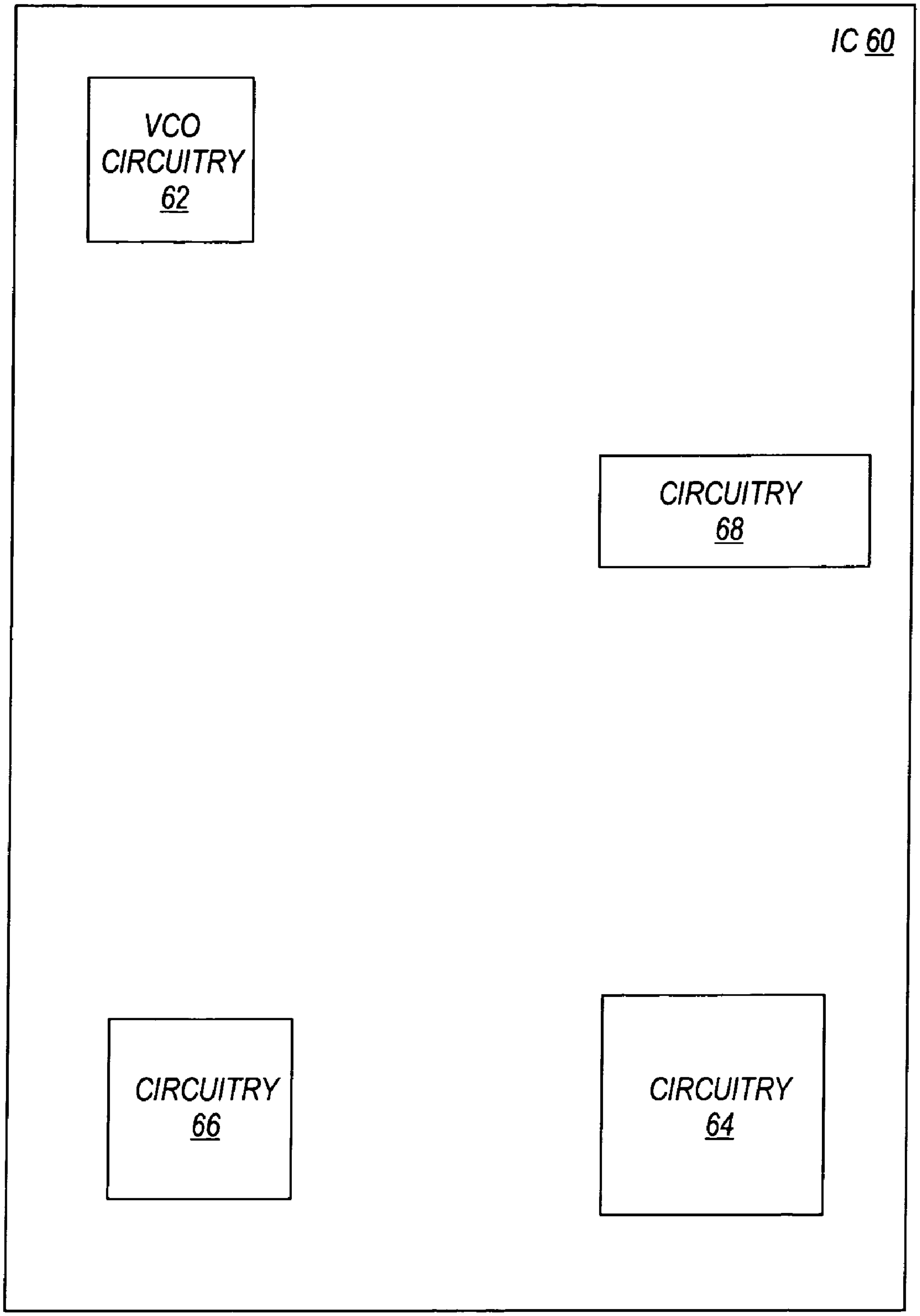
FIGS. 18-24 show circuitry formed on an integrated circuit to illustrate layout techniques of the present invention.

FIG. 18 is a diagram representing an IC 60 having several blocks of circuitry used in an RF apparatus. FIG. 18 shows VCO circuitry 62, and other blocks of circuitry 64, 66, and 68. Circuitry in other areas of the IC 60 is not shown. As mentioned above, the present invention can apply to any desired type of circuit and circuit partition. In the example shown in FIG. 18, assume that the VCO circuitry 62 required one or more inductances. Also assume that the VCO inductances tend to interfere with digital circuitry found in circuit blocks 64, 66, and/or 68. When laying out the circuitry blocks on the IC 60, a first technique for reducing interference between the VCO circuitry 62 and the other circuit is to position the VCO circuitry 62 far away from circuitry in which interference is a concern. If interference is still a problem, the inductor(s) provided in the VCO circuitry 62 can be magnetically differential inductors, such as those described above, to reduce the amount of interference. If interference is still a concern, the configuration of the inductor(s) and the layout of the IC 60 can be changed to optimize the configuration. Also note that inductances (whether intentional or parasitic) present in both interfering circuitry can be configured to reduce the amount of interference. For example, if an intentional inductor in the VCO circuitry 62 interferes with a parasitic inductance in another circuit block, magnetically differential inductors can be utilized by both the intentional inductor and by the parasitic inductance.

Figure 19:
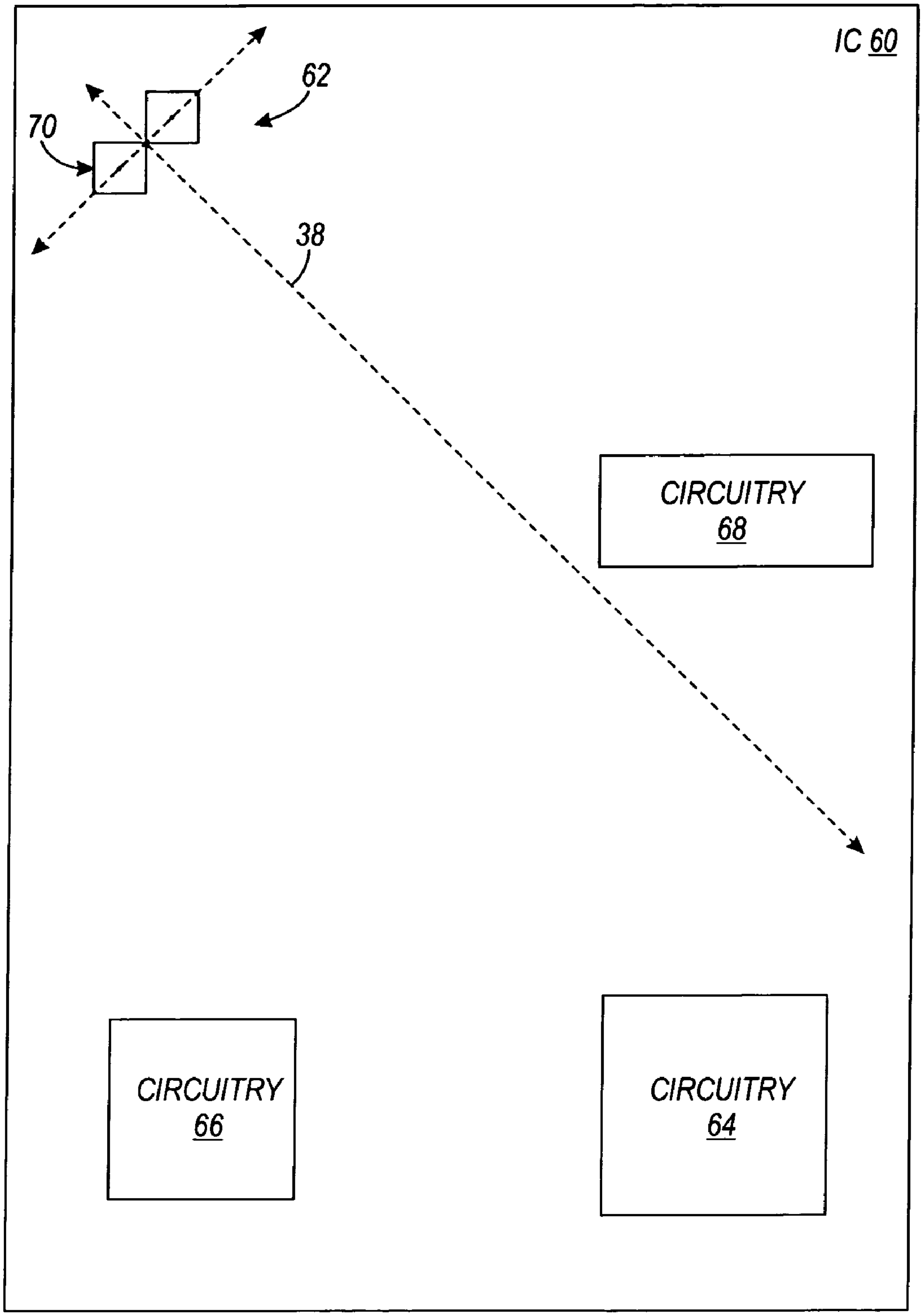

FIG. 19 shows the IC 60 with magnetically differential inductors 70, for example, like the inductors shown in FIG. 12. Note that the inductors are not necessarily drawn to scale, and are enlarged to illustrate the techniques of the invention. Also, the box shown around VCO circuitry 62 in FIG. 18 has been removed for clarity. As mentioned above, assume that, even with the magnetically differential inductors 70, interference with one or more of the circuitry blocks is a concern. As shown, and as was described in detail above, magnetic cancellation by the inductors 70 is greatest along axis 38.

Figure 20:
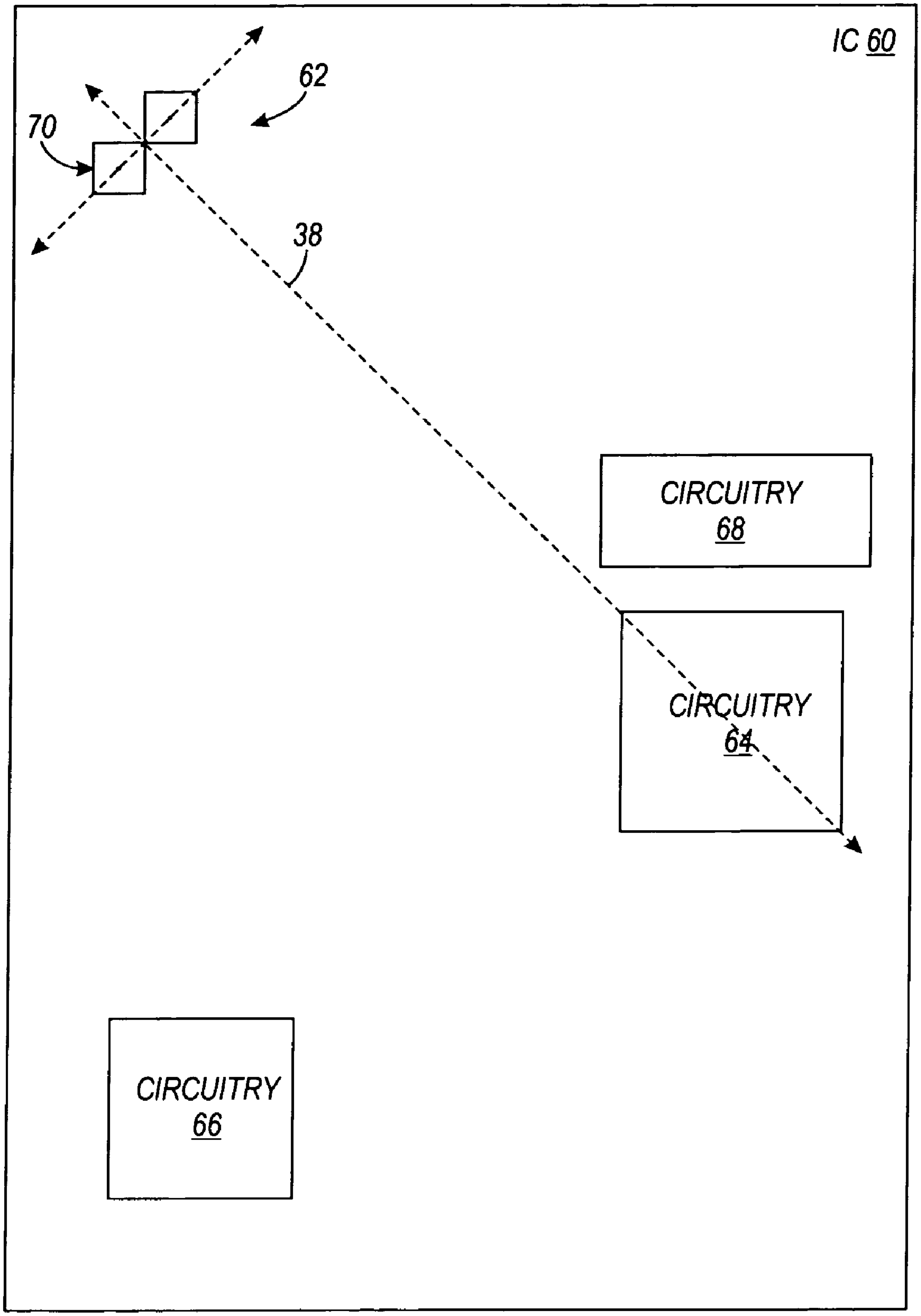

To further reduce interference, circuitry blocks and/or the inductors 70 can be moved. Now assume that interference between the VCO 62 and the block of circuitry 64 is a problem. FIG. 20 shows an example where the layout is changed based on the location of axis 38. As shown in FIG. 20, the block of circuitry 64 has been moved so that it is located along the axis 38 (the axis of optimal magnetic cancellation).

Figure 21:
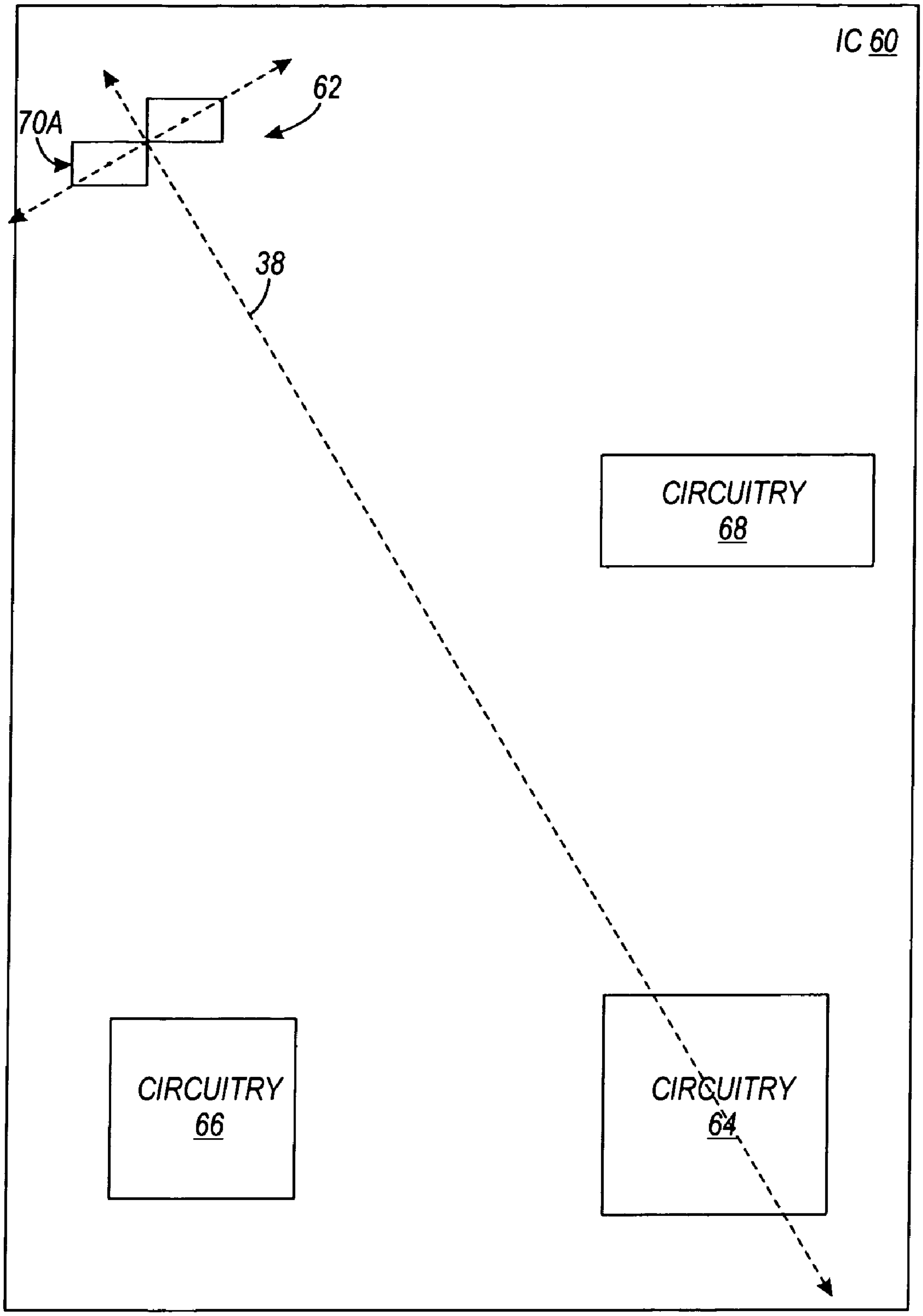

FIG. 21 shows an example where the configuration of the magnetically differential inductors is altered to minimize interference with circuitry 64. As shown, magnetically differential inductors 70A are configured in such a way that the axis 38 points toward the circuitry 64 (e.g., see FIG. 14), thus reducing the interference between the VCO circuitry 62 and the circuitry 64.

Figure 22:
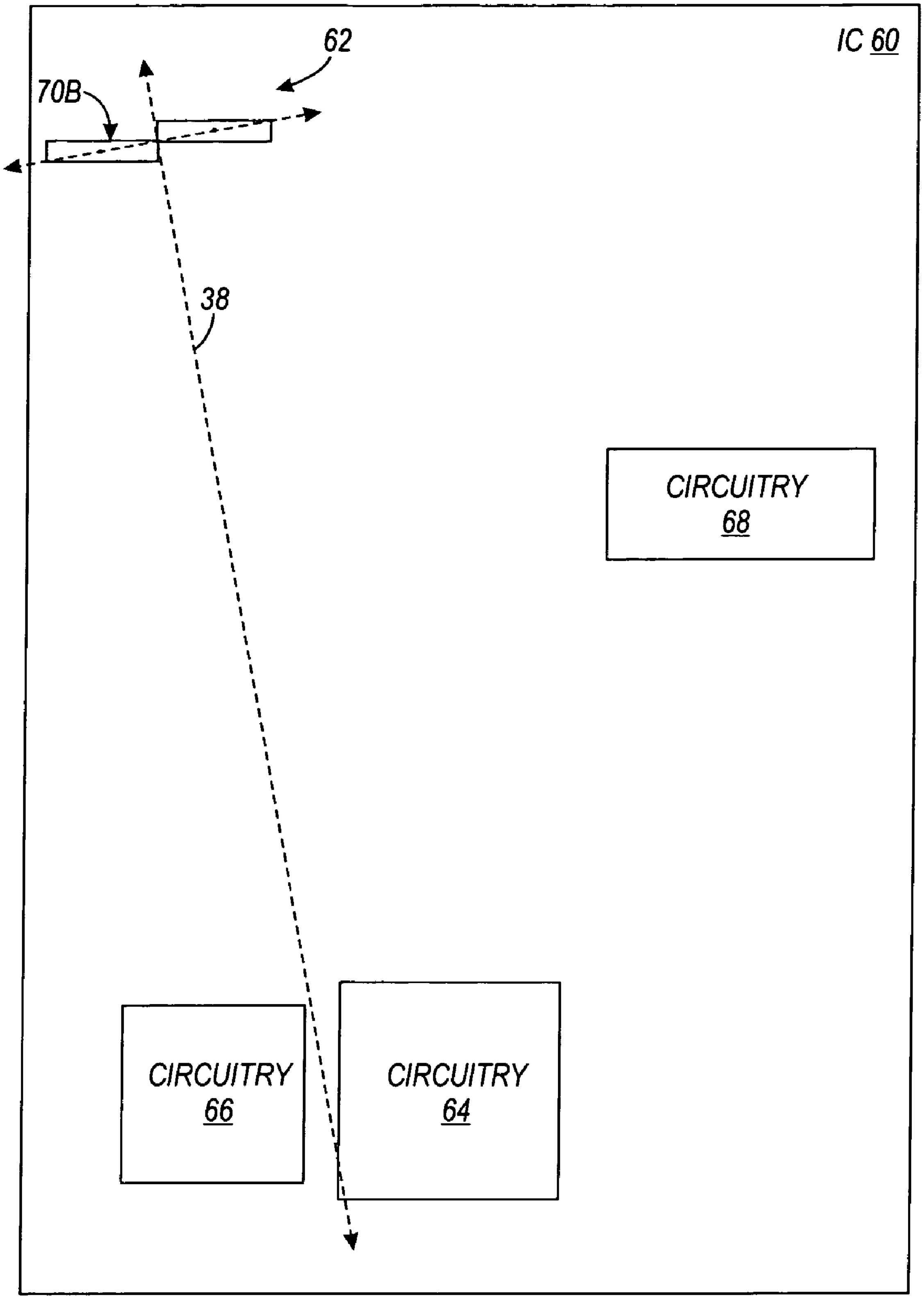

Now assume that interference between the VCO 62 and circuitry blocks 64 and 66 are a concern. FIG. 22 shows another example where the configuration of the magnetically differential inductors, and the layout of the IC 60 is altered to minimize interference between the VCO 62 and other circuitry on the IC 60. FIG. 22 shows an example where circuitry blocks 64 and 66 are positioned near each other. In addition, the magnetically differential inductors 70B are configured such that the axis 38 points toward both blocks of circuitry 64 and 66. If one of the blocks is more of a concern that the other, the configuration of the inductors, and/or the position of the circuitry blocks can be tweaked such that the axis 38 is closer to the circuitry that is more of a concern. In another example, multiple circuitry blocks can be positioned along the axis 38.

Figure 23:
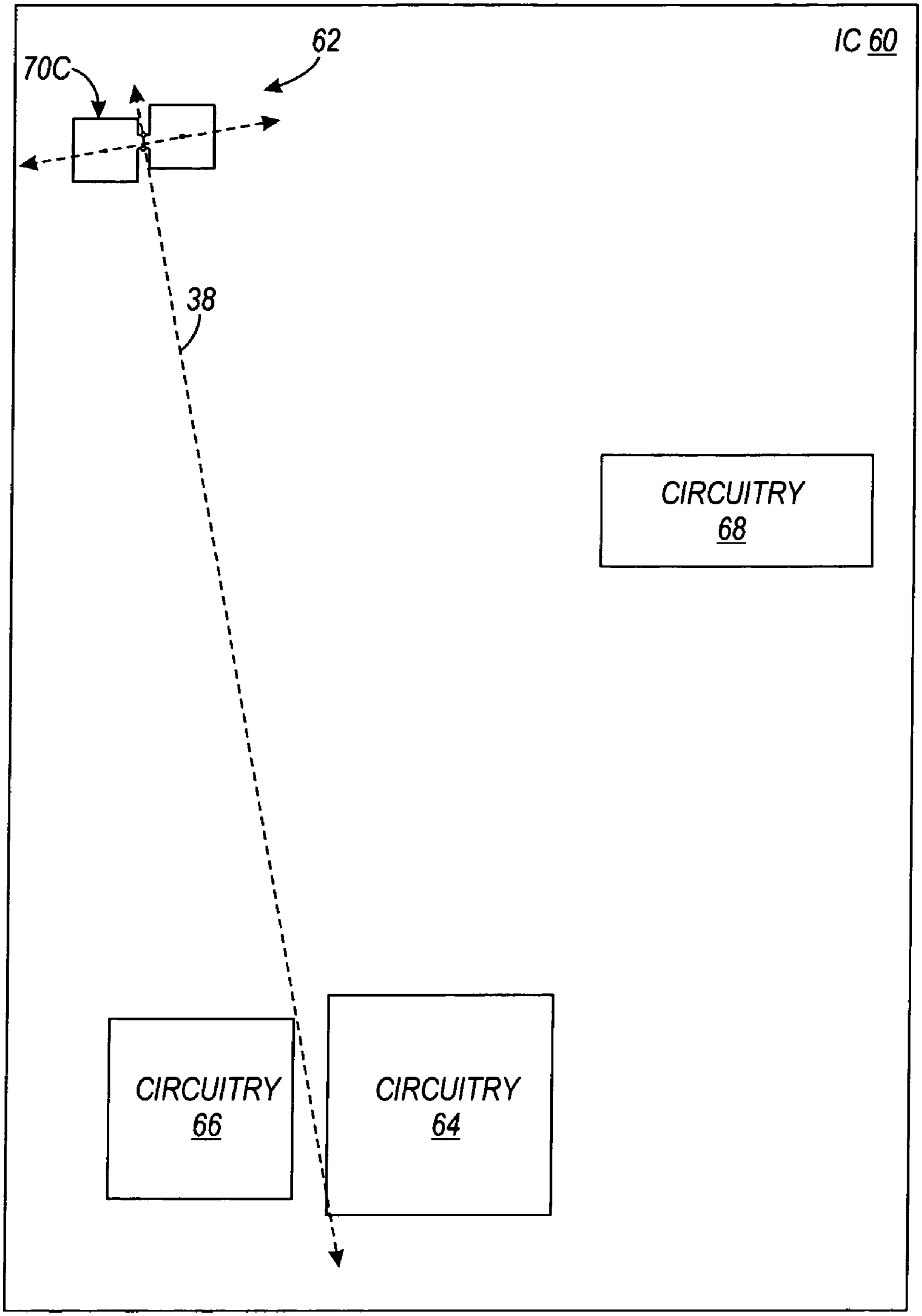

FIG. 23 shows an example that is the same as that shown in FIG. 22, except that parallel coupled magnetically differential inductors 70C are used in place of series coupled inductors. As shown, the inductors 70C are configured to point the axis 38 to both blocks of circuitry 64 and 66.

Figure 24:
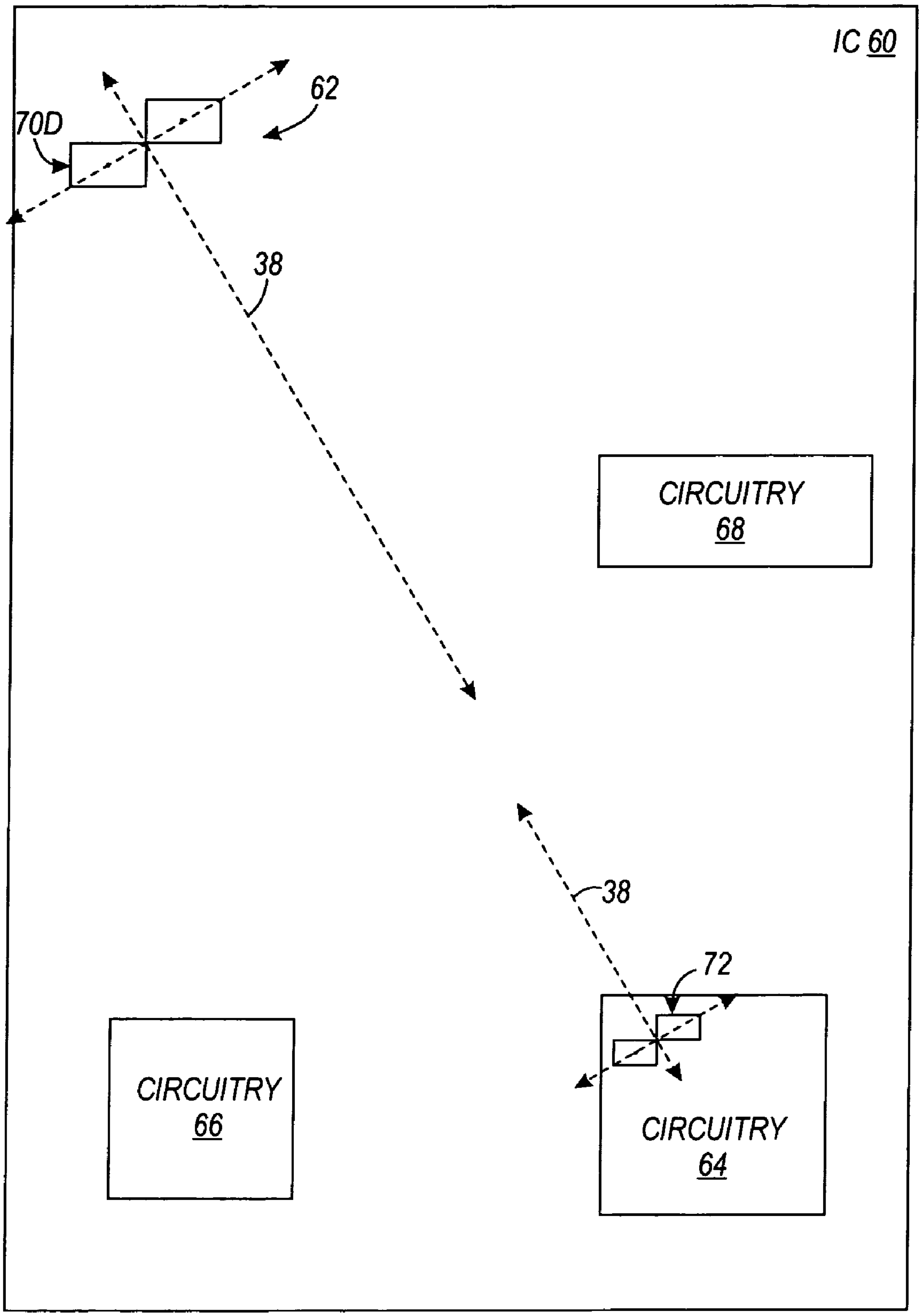

FIG. 24 shows an example like FIG. 21, where the configuration of the magnetically differential inductors is altered to minimize interference with circuitry 64. As shown, magnetically differential inductors 70A are configured in such a way that the axis 38 points toward the circuitry 64 (e.g., see FIG. 14), thus reducing the interference between the VCO circuitry 62 and the circuitry 64. In addition, to further reduce interference, a parasitic inductance in the block of circuitry 64 is configured with magnetically differential loops 72. The magnetically differential loops 72 are also configured so that the axis of optimal cancellation 38 points toward the magnetically differential inductors 70A. In another example, the concept of magnetically differential inductors can be applied to any circuitry where interference is a concern. For example, a large digital component can be divided into two smaller components with one of the smaller components oriented opposite the other component, such that the magnetic fields from one component at least partially cancel the magnetic fields from the other component. Similarly, the digital component could also be divided into four (or more) smaller components.

In another example, to help cancel magnetic fields, one or more portions of a circuit can be arranged in such a way that magnetic fields are canceled. For example, in the example of a large digital driver or buffer, driver circuitry can comprise two smaller driver circuits, where the two driver circuits are arranged as mirror images of each other, so that magnetic fields generated by the circuits are at least partially cancelled. Similarly, circuitry can comprise four circuits arranged in separate quadrants, and arranged in such a way that magnetic fields are canceled (i.e., in two groups of mirrored images). In other examples, circuitry can be comprised of other numbers of circuit portions arranged in ways that achieve some level of magnetic cancellation. These techniques can be used for any type of circuitry where magnetic cancellation is desired.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of minimizing interference between RF circuitry and digital circuitry on an integrated circuit comprising:

forming an inductance on the integrated circuit using first and second conductive loops coupled together, the first and second conductive loops defining a first axis extending through the first and second conductive loops and defining a second axis perpendicular to the first axis;

configuring the first and second conductive loops such that current flows in opposite directions in the first and second loops to at least partially cancel magnetic fields generated from the loops, and such that magnetic cancellation is maximized at locations along the second axis; and configuring relative positions of the inductance and circuitry on the integrated circuit to achieve a desired amount of magnetic cancellation.

2. The method of claim 1, wherein the first and second conductive loops are coupled together in series.

3. The method of claim 1, wherein the first and second conductive loops are coupled together in parallel.

4. The method of claim 1, wherein the second axis is located at approximately the mid point between the first and second conductive loops.

5. A method of minimizing interference on an integrated circuit comprising:

forming an inductance on the integrated circuit using a plurality of conductive loops configured to at least partially cancel magnetic fields generated from the loops; and configuring relative positions of the inductance and other circuitry on the integrated circuit to achieve a desired amount of magnetic cancellation, wherein the plurality of conductive loops are configured such that magnetic cancellation is maximized in a first direction extending from the inductance.

6. The method of claim 5, further comprising configuring the relative position of the other circuitry on the integrated circuit such that the other circuitry lies generally in the first direction from the inductance.

7. The method of claim 5, further comprising positioning a first circuit on the integrated circuit at a location that is generally positioned in the first direction, relative to the inductance, to minimize interference between the first circuit and the inductance.

8. The method of claim 5, wherein the inductance is part of voltage controlled oscillator circuitry formed on the integrated circuit.

9. The method of claim 8, wherein the other circuitry on the integrated circuit comprises digital circuitry.

10. An integrated circuit, comprising:

an inductance formed using a plurality of conductive loops adapted to at least partially cancel magnetic fields generated from the loops, wherein relative positions of the inductance and other circuitry on the integrated circuit are adapted so as to achieve a desired amount of magnetic cancellation, and wherein the plurality of conductive loops are adapted such that magnetic cancellation is maximized in a first direction extending from the inductance.

11. The integrated circuit of claim 10, wherein the other circuitry on the integrated circuit is formed such that the other circuitry lies generally in the first direction from the inductance.

12. The integrated circuit of claim 10, comprising a first circuit on the integrated circuit at a location that is generally positioned in the first direction, relative to the inductance, to minimize interference between the first circuit and the inductance.

13. The integrated circuit of claim 10, comprising radio-frequency circuitry.

14. The integrated circuit of claim 10, wherein the radio-frequency circuitry comprises transceiver circuitry.

15. The integrated circuit of claim 10, wherein the radio-frequency circuitry comprises receiver circuitry.

16. The integrated circuit of claim 10, wherein the radio-frequency circuitry comprises transmitter circuitry.

17. The integrated circuit of claim 10, comprising voltage controlled oscillator circuitry.

18. The integrated circuit of claim 17, wherein the inductance is part of the voltage controlled oscillator circuitry.

19. The integrated circuit of claim 17, wherein the voltage controlled oscillator circuitry is located within the integrated circuit so as to reduce interference within the integrated circuit.

20. The integrated circuit of claim 17, wherein the voltage controlled oscillator circuitry is positioned within the integrated circuit so as to reduce interference between the other circuitry on the integrated circuit and the inductance.

* * * * *